United States Patent
Polk, Jr. et al.

(10) Patent No.: US 7,103,828 B2
(45) Date of Patent: Sep. 5, 2006

(54) SYSTEM AND METHOD FOR INTERLEAVING AND TRANSMITTING FORWARD ERROR CORRECTION CODE WORDS

(75) Inventors: Charles E. Polk, Jr., Athens, AL (US); Darrin L. Gieger, Hampton Cove, AL (US)

(73) Assignee: ADIRAN, Inc., Huntsville, AL (US)

( * ) Notice: Subject to any disclaimer, the term of this patent is extended or adjusted under 35 U.S.C. 154(b) by 510 days.

(21) Appl. No.: 10/626,022

(22) Filed: Jul. 24, 2003

(65) Prior Publication Data

US 2005/0022092 A1    Jan. 27, 2005

(51) Int. Cl.
*H03M 13/05*    (2006.01)

(52) U.S. Cl. ..................... 714/776; 714/701

(58) Field of Classification Search ................ 714/701, 714/776
See application file for complete search history.

(56) References Cited

U.S. PATENT DOCUMENTS

| | | | |
|---|---|---|---|
| 4,998,252 A | 3/1991 | Suzuki et al. ............... 371/37.5 |
| 5,737,337 A | 4/1998 | Voith et al. ................... 371/2.2 |
| 5,983,388 A * | 11/1999 | Friedman et al. ........... 714/701 |
| 6,118,825 A | 9/2000 | Ikeda et al. .................. 375/259 |
| 6,377,557 B1 * | 4/2002 | Ohlson et al. ............... 370/320 |
| 6,480,976 B1 | 11/2002 | Pan et al. .................... 714/701 |
| 6,683,855 B1 | 1/2004 | Bordogna et al. |
| 6,922,806 B1 * | 7/2005 | Gibson et al. .............. 714/786 |
| 2001/0056563 A1* | 12/2001 | Kodama et al. ............ 714/701 |

FOREIGN PATENT DOCUMENTS

JP          09298526 A   * 11/1997

OTHER PUBLICATIONS

American National Standard for Telecommunications, ANSI TI 413-1998, *Network and Customer Installation Interfaces Asymmetric Digital Subscriber Line(ADSL) Metallic Interface,* Abstract and pp. 25-32.

* cited by examiner

*Primary Examiner*—R. Stephen Dildine
(74) *Attorney, Agent, or Firm*—Thomas, Kayden, Horstemeyer, & Risley, L.L.P.

(57) ABSTRACT

A forward error correction system comprises a forward error correction (FEC) manager and a transmitter. The FEC manager is configured to receive a data stream and to define a plurality of FEC code words based on the data stream. Each of the FEC code words comprises a data portion and a checksum portion that may be used to recover at least one character of the data portion. The FEC manager is configured to interleave characters of the FEC code words such that the FEC code words are transmitted, by the transmitter, to a remote receiver in an interleaved fashion. The FEC manager is configured to provide characters from each of the FEC code words to the transmitter before a plurality of characters to be assigned to each of the FEC code words has been received by the FEC manager.

28 Claims, 8 Drawing Sheets

/—114

| | col. 1 | col. 2 | ... | col. k | col. k+1 | col. k+2 | ... | col. n |
|---|---|---|---|---|---|---|---|---|
| row 1 | Char 1 | Char m+1 | ... | Char m(k-1)+1 | CS Char 1, 1 | CS Char 1, 2 | ... | CS Char 1, n-k |
| row 2 | Char 2 | Char m+2 | ... | Char m(k-1)+2 | CS Char 2, 1 | CS Char 2, 2 | ... | CS Char 2, n-k |
| ⋮ | ⋮ | ⋮ | ... | ⋮ | ⋮ | ⋮ | ... | ⋮ |
| row m-1 | Char m-1 | Char 2m-1 | ... | Char mk-1 | CS Char m-1, 1 | CS Char m-1, 2 | ... | CS Char m-1, n-k |
| row m | Char m | Char 2m | ... | Char mk | CS Char m, 1 | CS Char m, 2 | ... | CS Char m, n-k |

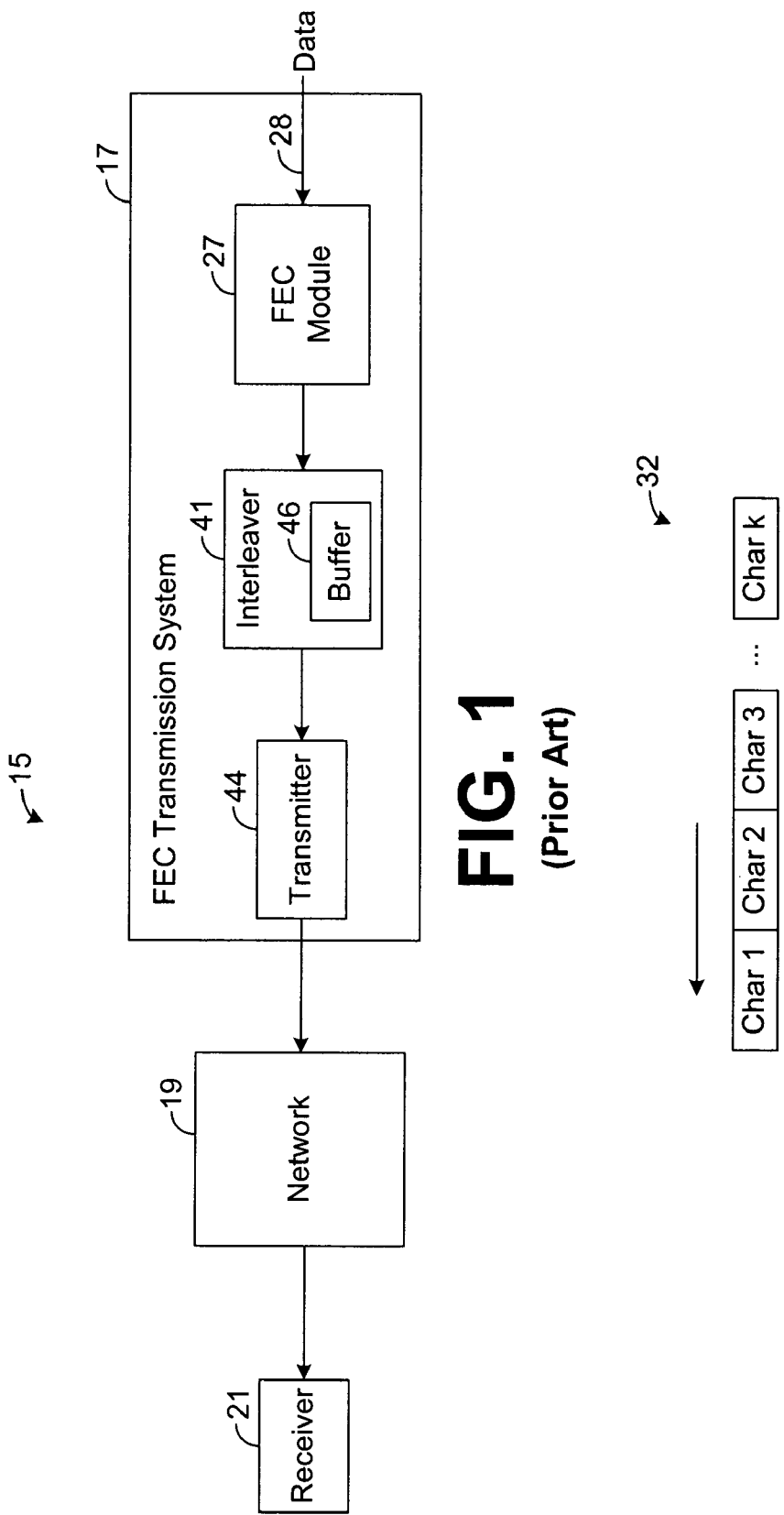

FIG. 11
FIG. 12
FIG. 15

SYSTEM AND METHOD FOR INTERLEAVING AND TRANSMITTING FORWARD ERROR CORRECTION CODE WORDS

RELATED ART

In conventional forward error correction (FEC) communication systems, data is often encoded into code words before being transmitted to a receiver at a remote premises. Each code word typically comprises a plurality of characters, and each character usually has the same bit length, although characters of differing bit lengths are also possible. In encoding data into a code word, an encoder typically appends, to the data, additional characters, sometimes collectively referred to as a "checksum." The checksum appended to the data characters within a particular code word comprises redundant information about the data characters, and this redundant information may be used to recover one or more data characters of the code word if part of the code word is corrupted during transmission.

In this regard, when a code word is transmitted along a transmission medium between a transmitter and a receiver, it is possible for impulse noise occurring on the transmission medium to corrupt only a small number of characters within a transmitted code word. Depending on the number of characters corrupted by the impulse noise, it is sometimes possible for the receiver to use the code word's checksum to recover the corrupted characters. In particular, the checksum may be used to recover corrupted characters within a code word as long as the number of corrupted characters is below some predefined threshold depending on the type of checksum that is appended to the code word. If the number of corrupted characters exceeds this predefined threshold, then recovery of the corrupted characters is usually impossible. Thus, it is generally desirable to minimize the number of characters that are corrupted during transmission of a particular code word.

Interleaving of code words is often employed by FEC communication systems in an effort to reduce the number of corrupted characters within the same code word. When a particular code word is interleaved with one or more other code words, each character of the particular code word is separated by one or more characters of other code words depending on the number of code words being interleaved. Thus, the number of characters within the particular code word that are corrupted by a single occurrence of impulse noise is reduced thereby increasing the probability that corrupted bits within the particular code word may be recovered at the receiver.

To further illustrate the effects of interleaving, assume a first code word defined by four characters $X_0$, $X_1$, $X_2$, and $X_3$ is to be interleaved with a second code word defined by four characters $Y_0$, $Y_1$, $Y_2$, and $Y_3$. In such an example, a transmitter may transmit, in an interleaved fashion, the foregoing characters in the following sequential order: $X_0$, $Y_0$, $X_1$, $Y_1$, $X_2$, $Y_2$, $X_3$, $Y_3$. Thus, a character of the second code word is transmitted between each character of the first code word. As a result, if an occurrence of impulse noise corrupts two successively transmitted characters (e.g., $X_1$, $Y_1$), then only one character from each code word is corrupted.

Note that if the first code word is instead transmitted in a non-interleaved fashion prior to the second code word, then it is possible for the aforementioned impulse noise occurrence to corrupt two characters of the same code word. Moreover, by interleaving the two code words, as described above, the effect of the impulse noise is spread to multiple code words thereby increasing the probability that the receiver will be able to recover the characters corrupted by the impulse noise. As a result, the robustness of a data communication system is generally increased if code words are interleaved prior to transmission.

Note that increasing the number of code words that are interleaved together prior to transmission has the effect of enabling the transmission to withstand impulse noise of longer durations. For example, if four code words are interleaved in a manner similar to the interleaving methodology described above, then it is possible for an occurrence of impulse noise to corrupt four consecutive characters without corrupting more than one character in any single code word. However, increasing the number of code words that are interleaved also has the adverse effect of increasing the transmission latency of the code words. In this regard, if m code words are to be interleaved together, then a transmitter typically waits to receive all m code words before commencing transmission of any one of the m code words. Thus, increasing the number of interleaved code words (i.e., increasing m) introduces a greater transmission delay.

Moreover, techniques for increasing the robustness and reducing the transmission latency of an FEC communication system are generally desirable.

SUMMARY OF THE INVENTION

Generally, embodiments of the present invention provide a forward error correction (FEC) system and method for interleaving and transmitting FEC code words.

A system in accordance with one embodiment of the present invention comprises a forward error correction (FEC) manager and a transmitter. The forward error correction (FEC) manager is configured to receive, from a data stream, a first string of successive characters and a second string of successive characters. The FEC manager is further configured to define a plurality of FEC code words based on the data stream and to interleave the characters of the first and second strings such that each of the FEC code words comprises characters from both of the strings. The transmitter is configured to transmit the FEC code words to a remote receiver.

A system in accordance with another embodiment of the present invention also comprises a forward error correction (FEC) manager and a transmitter. The FEC manager is configured to receive a data stream and to define a plurality of FEC code words based on the data stream. Each of the FEC code words comprises a data portion and a checksum portion that may be used to recover at least one character of the data portion. The FEC manager is configured to interleave characters of the FEC code words such that the FEC code words are transmitted, by the transmitter, to a remote receiver in an interleaved fashion. The FEC manager is configured to provide characters from each of the FEC code words to the transmitter before a plurality of characters to be assigned to each of the FEC code words has been received by the FEC manager.

A method in accordance with one embodiment of the present invention comprises the following steps: receiving a data stream, the data stream comprising a first string of successive characters and a second string of successive characters; defining a plurality of FEC code words based on the data stream in an interleaved fashion such that each of the FEC code words comprises characters from both of the strings; and transmitting the FEC code words to a remote receiver.

A method in accordance with another embodiment of the present invention comprises the steps of: receiving a data stream; defining a plurality of FEC code words based on characters received via the receiving step; interleaving the FEC code words; and transmitting the interleaved FEC code words to a remote receiver, wherein the transmitting step comprises the step of transmitting characters from each of the FEC code words to the receiver before a plurality of characters to be assigned to each of the FEC code words has been received via the receiving step.

BRIEF DESCRIPTION OF THE DRAWINGS

The invention can be better understood with reference to the following drawings. The elements of the drawings are not necessarily to scale relative to each other, emphasis instead being placed upon clearly illustrating the principles of the invention. Furthermore, like reference numerals designate corresponding parts throughout the several views.

FIG. 1 is a block diagram illustrating a conventional FEC communication system.

FIG. 2 is a block diagram illustrating a sequence of data characters received by the FEC communication system of FIG. 1.

FIG. 11 is a block diagram illustrating an exemplary sequence of data characters received by the FEC manager depicted in FIG. 6.

FIG. 12 is a block diagram illustrating the buffer depicted in FIG. 6 when such buffer is buffering the data characters depicted in FIG. 11 in accordance with an exemplary embodiment of the present invention.

FIG. 15 is a block diagram illustrating an exemplary sequence of characters transmitted from the buffer of FIG. 12 by the FEC manager of FIG. 6.

DETAILED DESCRIPTION

Figures 3, 4:
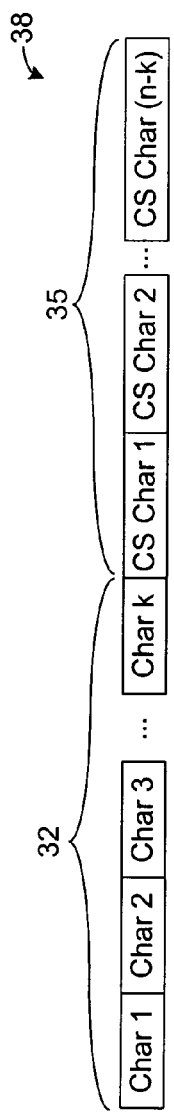
FIG. 3 is a block diagram illustrating a code word formed by an FEC module depicted in FIG. 1.
FIG. 4 is a block diagram illustrating a buffer within an interleaver depicted in FIG. 1.

The present invention generally relates to a forward error correction (FEC) communication system and method that efficiently interleave FEC code words prior to transmission. In one embodiment, an FEC transmission system reduces transmission latency by transmitting interleaved code words while the checksums for these code words are being formed. Indeed, portions of the code words may be transmitted before other portions of the code words are received and/or buffered by the FEC transmission system. Thus, the transmission latency of the FEC transmission system may be reduced, and more code words may be interleaved together without significantly impacting the transmission efficiency of the FEC transmission system.

FIG. 1 depicts a conventional FEC communication system 15 that communicates data from an FEC transmission system 17 through a network 19 to a receiver 21 that is remotely located from the transmission system 17. As will be described in more detail hereinbelow, the FEC transmission system 17 forms FEC code words and interleaves these code words, thereby enhancing the probability that the receiver 21 will be able to successfully employ forward error correction techniques to recover corrupted characters within the transmitted code words.

In this regard, as shown by FIG. 1, the transmission system 17 comprises a forward error correction (FEC) module 27 that receives, from data stream 28, blocks of data to be transmitted to the receiver 21 by the transmission system 17. As shown by FIG. 2, each data block 32 comprises k characters, where k is any positive integer value. Note that each character of a data block 32 may comprise any number of bits.

For each block 32, the FEC module 27 defines a checksum block 35 and appends the checksum block 35 to the data block 32 to form a code word 38, as shown by FIG. 3. The checksum block 35 is based on the data block 32 to which the checksum block 35 is appended, and the checksum block 35 defines sufficient information for enabling the receiver 21 to recover at least one corrupted character of the data block 32 via conventional forward error correction techniques. Thus, the entire code word 38 comprises n number of characters in which n is an integer value greater than k (i.e., the number of characters within the data block 32). Moreover, the number of characters of the checksum block 35 may be represented by the expression (n−k).

As shown by FIG. 1, each code word 38 (FIG. 3) formed by the FEC module 27 is transmitted to an interleaver 41, which buffers and interleaves the code words 38 before such words 38 are transmitted by a transmitter 44. In this regard, the interleaver 41 comprises a buffer 46 in which the code words 38 from the FEC module 27 are temporarily stored. Once an m number of code words 38 are buffered, the m number of code words 38 are read out of the buffer 46 in an interleaved fashion and transmitted by the transmitter 44 to the remote receiver 21.

To better illustrate the foregoing, refer to FIG. 4, which shows an m number of code words 38 (FIG. 3) stored in the buffer 46. In FIG. 4, each different code word is stored in a different row of the buffer 46. Thus, a first code word received by the buffer 46 is stored in a first row, referred to as "row 1," of the buffer 46 and extends from "column 1" to "column n." This code word comprises k number of characters respectively referred to as "Char 1" through "Char k." The code word of "row 1" also comprises (n−k) number of checksum (CS) characters, respectively referred to as "CS Char 1, 1" through "CS Char 1, n−k." Note that the nomenclature for the checksum characters discussed herein adheres to the following syntactical expression "CS Char x, y," where x refers to the row number in which the checksum character is stored and y identifies the CS character from the other CS characters of the same code word (i.e., the other CS characters stored in the same row). For example, the first checksum character stored in "row 1" is represented via the expression "CS Char 1, 1," and the last checksum character stored in "row 1" is represented via the expression "CS Char 1, n–k."

Note that the CS characters of the same row in FIG. 4 collectively define information that may be used to recover corrupted characters of the data block 32 (FIG. 3) within the same buffer row. For example, "CS Char 1, 1" through "CS Char 1, (n–k)" stored within "row 1" of buffer 46 (FIG. 4) define information that may be used to recover at least one of the data block characters, "Char 1" through "Char k" stored in "row 1."

As shown by FIG. 4, a second code word received by the buffer 46 is stored in a second row, referred to as "row 2," of the buffer 46. This code word comprises k number of characters respectively referred to as "Char (k+1)" through "Char 2k." The code word of "row 2" also comprises (n–k) number of checksum characters, respectively referred to as "CS Char 2, 1" through "CS Char 2, n–k." Note that "CS Char 2, 1" through "CS Char 2, n–k" stored within "row 2" define information that may be used to recover at least one of the data block characters, "Char k+1" through "Char 2k" stored in "row 2." Furthermore, each successively received code word is stored in a successive row of the buffer 46 in a similar manner.

Thus, the penultimate code word of the m number of code words received by the buffer 46 is stored in yet another row, referred to as "row m–1," of the buffer 46. This code word comprises k number of characters respectively referred to as "Char (m–2)k+1" through "Char (m–1)k," and the foregoing code word also comprises (n–k) number of CS characters respectively referred to as "CS Char m–1, 1" through "CS Char m–1, n–k." Note that "CS Char m–1, 1" through "CS Char m–1, n–k" stored within "row m–1" define information that may be used to recover at least one of the data block characters "Char (m–2)k+1" through "Char (m–1)k" stored in "row m–1."

Finally, the last code word of the m number of code words received by the buffer 46 is stored in yet another row, referred to as "row m," of the buffer 46. This code word comprises k number of data block characters respectively referred to as "Char (m–1)k+1" through "Char mk," and the foregoing code word also comprises (n–k) number of CS block characters respectively referred to as "CS Char m, 1" through "CS Char m, n–k." Note that "CS Char m, 1" through "CS Char m, n–k" stored within "row m" define information that may be used to recover at least one of the data block characters, "Char (m–1)k+1" through "Char mk," stored in "row m."

Once all m code words are buffered in the buffer 46, the interleaver 41 begins transmitting each of the buffered characters, row-by-row, for each column until the characters in all n columns have been transmitted. In this regard, the interleaver 41 transmits the character in "column 1," "row 1" and then transmits the character in "column 1," "row 2." The interleaver 41 continues transmitting the characters of "column 1," row-by-row, until all of the characters of "column 1" have been transmitted. Then, the interleaver 41 begins to transmit the characters of "column 2" in the same manner until all of the characters of "column 2" have been transmitted. The interleaver 41 continues to transmit the characters of each column in such a manner until all of the buffered characters of the m code words are transmitted. Thus, the output of the interleaver 41 appears as shown in FIG. 5.

Figure 5:
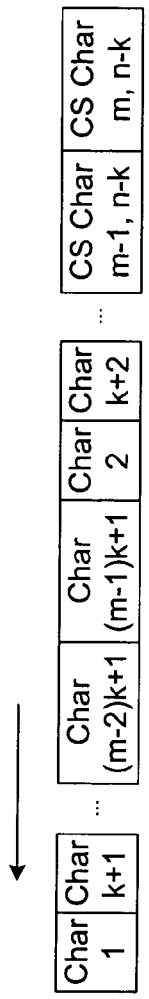
FIG. 5 is a block diagram illustrating a sequence of characters transmitted from the interleaver of FIG. 1.

More specifically, referring to FIGS. 4 and 5, the interleaver 41 transmits "Char 1," "Char k+1" . . . "Char (m–2)k+1," and "Char (m–1)k+1" from "column 1." Then, the interleaver 41 transmits "Char 2," "Char k+2," . . . "Char (m–2)k+2," and "Char (m–1)k+2" from "column 2." After transmitting k columns of data characters, the interleaver 41 begins transmitting the CS characters. In particular, after transmitting k columns of data characters, the interleaver 41 transmits "CS Char 1, 1;" "CS Char 2, 1;" . . . "CS Char m–1, 1;" and "CS Char m, 1" from "column k+1." Then, the interleaver 41 transmits "Char 1,2;" "CS Char 2, 2;" . . . "CS Char m–1, 2;" and "CS Char m, 2" from "column k+2." The interleaver 41 continues transmitting the columns of CS characters until all of the CS characters and, therefore, all of the buffered characters of FIG. 4 are transmitted. Note that the interleaver 41 repeats the aforedescribed process of buffering and transmitting for each set of m code words received from the FEC module 27. In addition, the characters transmitted by the interleaver 41 are received by the transmitter 44 and transmitted, in the same order, to the receiver 21.

As can be seen by examining FIGS. 4 and 5, the characters of the m code words buffered and transmitted by the interleaver 41 are interleaved such that an occurrence of impulse noise may corrupt up to m number of consecutively transmitted characters without corrupting two characters from the same code word 38 (i.e., the same buffer row). Thus, the receiver 21 may utilize the checksum characters to recover the data characters corrupted by an occurrence of impulse noise of relatively long duration. Moreover, as m increases, the robustness of the system 15 increases as well. However, as noted above, the interleaver 41 waits for each code word of the m set of code words before initiating transmission of any of the characters of the m code words. Therefore, transmission latency increases as m increases.

Figure 6:
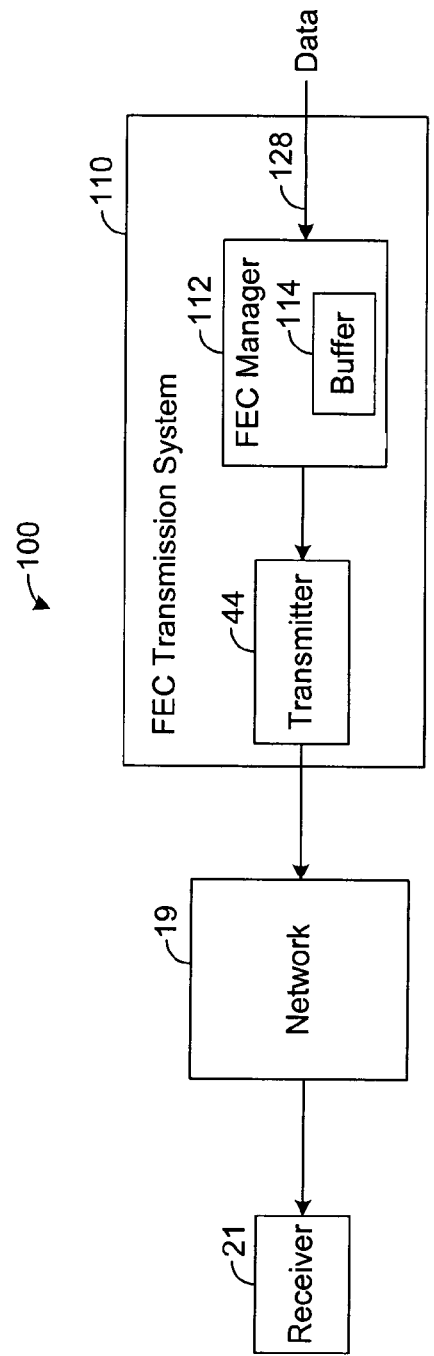
FIG. 6 is a block diagram illustrating an FEC communication system in accordance with an exemplary embodiment of the present invention.

An FEC communication system in accordance with the present invention helps to minimize the transmission latency caused by code word interleaving. FIG. 6 depicts an FEC communication system 100 in accordance with one embodiment of the present invention. The system 100 comprises an FEC transmission system 110 for transmitting data to a receiver 21 that is remotely located from the transmission system 110. As shown by FIG. 6, the transmitted data may pass through a network 19, which routes the data to the receiver 21 via known or future-developed network routing techniques.

The transmission system 110 comprises a forward error correction (FEC) manager 112 that receives, from a data stream 128, data to be transmitted to the receiver 21. The FEC manager 112 buffers this data in a buffer 114 and appends checksum information to this data thereby forming FEC code words to be communicated to the receiver 21. As in the conventional system 15 depicted in FIG. 1, the receiver 21 of FIG. 6 may use the checksum information within a code word to recover at least one corrupted character within the same code word via known or future-developed FEC recovery techniques. Furthermore, as will be described in more detail hereafter, the FEC manager 112 also interleaves the received data such that characters from the same code word are not successively transmitted to the receiver 21 thereby helping to enhance the probability that the receiver 21 will be able to recover corrupted characters.

It should be noted that the FEC manager 112 can be implemented in software, hardware, or a combination thereof. In an exemplary embodiment illustrated in FIG. 7, the FEC manager 112, along with its associated methodology, is implemented in software and stored in memory 116 of the FEC transmission system 110.

Note that the FEC manager 112, when implemented in software, can be stored and transported on any computer-readable medium for use by or in connection with an instruction execution system, apparatus, or device, such as a computer-based system, processor-containing system, or other system that can fetch and execute instructions. In the context of this document, a "computer-readable medium" can be any means that can contain, store, communicate, propagate, or transport a program for use by or in connection with the instruction execution system, apparatus, or device. The computer readable-medium can be, for example but not limited to, an electronic, magnetic, optical, electromagnetic, infrared, or semiconductor system, apparatus, device, or propagation medium. Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in memory.

Figure 7:
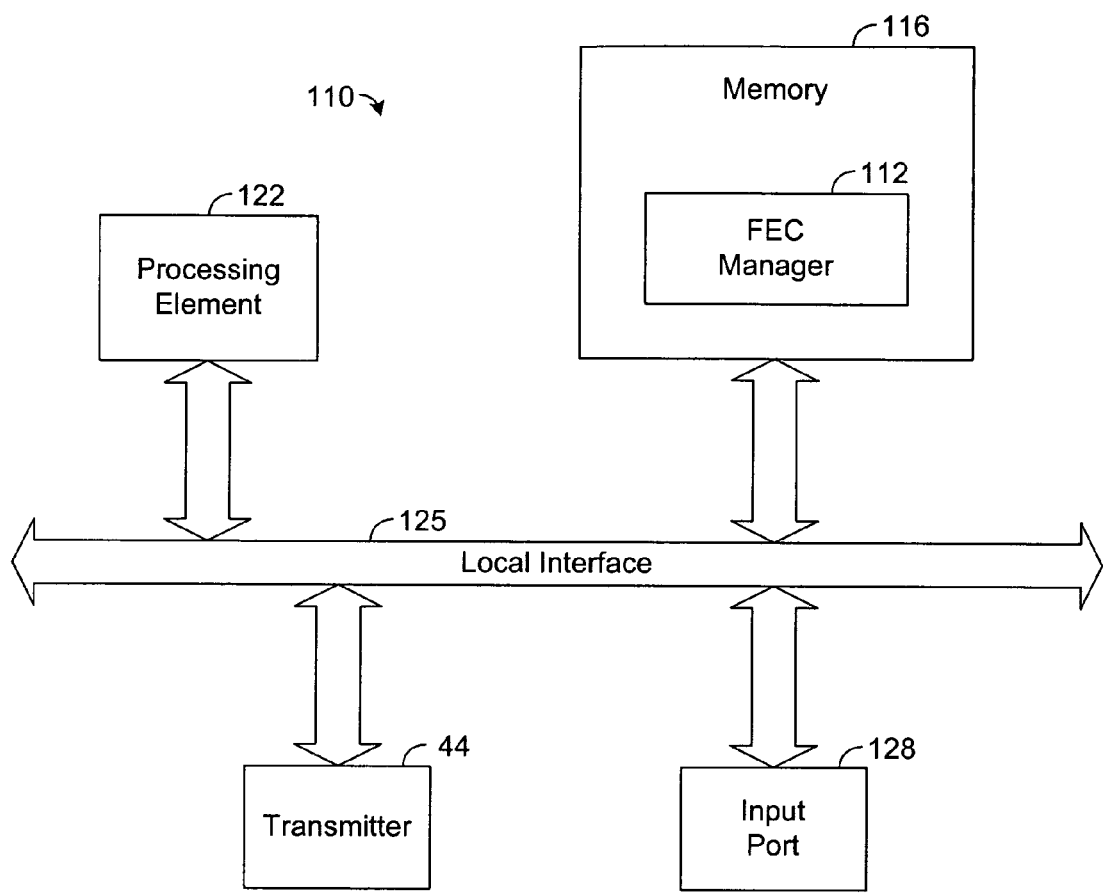
FIG. 7 is a block diagram illustrating an exemplary embodiment of an FEC transmission system within the communication system depicted by FIG. 6.

The exemplary embodiment of the FEC transmission system 110 depicted by FIG. 7 comprises at least one conventional processing element 122, such as a digital signal processor (DSP) or a central processing unit (CPU), that communicates to and drives the other elements within the system 110 via a local interface 125, which can include at least one bus. Furthermore, the system 110 may comprise an input port 128 for receiving the data stream 128 to be communicated to the receiver 21. The input port 128 may receive this data stream 128 from any known or future-developed component or device, such as, for example, a computer, a telephone, a facsimile machine, etc.

Similar to the conventional FEC module 27 of FIG. 1, the FEC manager 112 of FIG. 6 receives data to be communicated to the receiver 21 and forms code words based on this data. However, unlike the code words formed by the conventional FEC module 27 of FIG. 1, for each code word formed by the FEC manager 112, all of the characters of the code word are not successively received by the FEC manager 112. In this regard, the FEC manager 112 interleaves, across multiple code words, successive characters in the data stream 128 received by the FEC manager 112. Thus, the FEC manager 112 may begin transmitting the code words before formation of the code words is complete, thereby reducing the transmission latency associated with the FEC transmission system 110.

It should be noted that there are a variety of methodologies that may be employed to interleave the received data stream 128 across multiple code words. For illustrative purposes, an exemplary methodology of performing such interleaving will be described hereafter. However, it is possible for the interleaving to be achieved via other methodologies not specifically described in detail herein.

Figure 8:
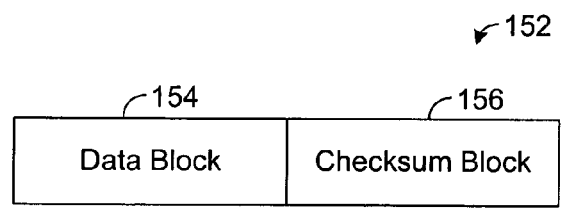
FIG. 8 is a block diagram illustrating an exemplary code word formed by an FEC manager depicted in FIG. 6.

As shown by FIG. 8, each code word 152 formed by the FEC manager 112, like the code words 38 (FIG. 3) formed by the conventional FEC module 27 of FIG. 1, comprises a data block 154 of k characters and a checksum block 156. The checksum block 156 comprises checksum information that enables the receiver 21 to recover one or more corrupted characters of the data block 154 in the same code word 152. The total number of characters of the code word 152 is represented as n, and the number of characters of the checksum block 156 is, therefore, (n−k).

Figures 9, 10:
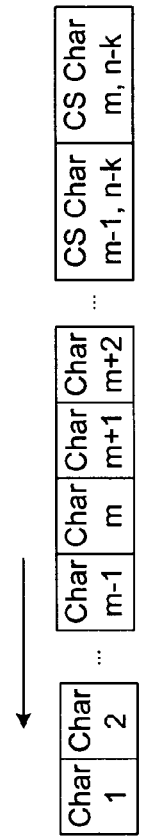
FIG. 9 is a block diagram illustrating an exemplary embodiment of a buffer within the FEC manager depicted in FIG. 6.
FIG. 10 is a block diagram illustrating an exemplary sequence of characters transmitted from the FEC manager depicted in FIG. 6.

Assume that the FEC manager 112 is to form and interleave m number of code words collectively comprising mk characters received from the data stream 128. In such an example, the buffer 114 preferably comprises m rows of n columns, as shown by FIG. 9. As will be described in more detail hereafter, each row may be used to buffer a different code word 152 (FIG. 8).

Each successive string of m characters received from the data stream 128 is preferably stored, by the FEC manager 112, in a different buffer column, and each character stored in the same buffer column is preferably stored in a different buffer row. In particular, the first m characters received by the FEC manager 112 are preferably stored in "row 1" through "row m," respectively, of "column 1," as shown by FIG. 9. The next m characters received by the FEC manager 112 are then stored in the next column (i.e., "column 2"), and the remaining strings of m characters are stored in the remaining columns in the same manner. Note that a "string" generally refers to any number and any type of successive characters to be transmitted to the remote receiver 21.

Furthermore, as the m characters are being stored in "column 1" through "column k," the FEC manager 112 may define the checksum data stored in "column k+1" through "column n." For example, for each character received and stored, as described above, the FEC manager 112 may appropriately update the checksum information of the code words being formed in the buffer 114 such that the checksum information is substantially defined and stored in the buffer 114 when the last character (i.e., "Char mk") is stored to the buffer 114.

Moreover, once all mk characters from the data stream 128 are stored in the buffer 114 and the checksum information has been appropriately updated for each such character, the buffer 114 defines m code words 152 (FIG. 8). In particular, each different row of the buffer 114 defines a different code word. For each row, the data block 154 (FIG. 8) of the associated code word 152 is stored in "column 1" through "column k," and the checksum block 156 (FIG. 8) of the associated code word 152 is stored in "column k+1" through "column n." The checksum information of the checksum block 156 is based on the characters in the data block 154 of the same code word 152 and is preferably independent of the values in the other code words 152 (i.e., of the values stored in the other rows of the buffer 114).

Note that the FEC manager 112 preferably outputs the characters stored in the buffer 114 in the same manner that the conventional interleaver 41 of FIG. 1 outputs the characters stored in the buffer 46. In particular, the FEC manager 112 outputs the m number of code words 152 in an interleaved fashion. For example, the FEC manager 112 may output all the characters of one column before outputting the characters of any other column. The FEC manager 112 may continue outputting characters via such a column-by-column basis until all of the characters in the buffer 114 have been output by the FEC manager 112.

Moreover, the FEC manager 112 transmits each of the buffered characters, row-by-row, for each column until the characters in all n columns have been transmitted. In this regard, the FEC manager 112 transmits the character in "column 1," "row 1" and then transmits the character in "column 1," "row 2." The FEC manager 112 continues transmitting the characters of "column 1," row-by-row, until all of the characters of "column 1" have been transmitted. Then, the FEC manager 112 begins to transmit the characters of "column 2" in the same manner until all of the characters of "column 2" have been transmitted. The FEC manager 112 continues to transmit the characters of each column in such a manner until all of the buffered characters of the m code words are transmitted. Thus, the output of the FEC manager 112 appears as shown in FIG. 10.

More specifically, referring to FIGS. 9 and 10, the FEC manager 112 sequentially transmits "Char 1," "Char 2,". "Char m−1," and "Char m" from "column 1." Then, the FEC manager 112 transmits "Char m+1," "Char m+2," . . . "Char 2m−1," and "Char 2m" from "column 2." After transmitting k columns of data characters, the FEC manager 112 begins transmitting the CS characters. In particular, after transmitting k columns of data characters, the FEC manager 112 transmits "CS Char 1, 1;" "CS Char 2, 1;" . . . "CS Char m−1, 1;" and "CS Char m, 1" from "column k+1." Then, the FEC manager 112 transmits "Char 1, 2;" "CS Char 2, 2;" . . . "CS Char m−1, 2;" and "CS Char m, 2" from "column k+2." The FEC manager 112 continues transmitting the columns of CS characters until all of the CS characters and, therefore, all of the buffered characters of FIG. 9 are transmitted. Note that the FEC manager 112 repeats the aforedescribed process of receiving, buffering, and transmitting new sets of mk data characters for as long as the FEC manager 112 continues to receive new data from the data stream 128. In addition, the characters transmitted by the FEC manager 112 are received by the transmitter 44 and transmitted, in the same order, to the receiver 21.

As can be seen by examining FIGS. 9 and 10, the m code words buffered and transmitted by the FEC manager 112 are interleaved, similar to the code words output by the interleaver 41 of FIG. 1. Therefore, a lower number of characters in the same code word are corrupted by the same impulse noise occurrence. Indeed, an occurrence of impulse noise may corrupt up to m number of consecutively transmitted characters without corrupting two characters from the same code word. Furthermore, the FEC manager 112 may begin transmitting characters received from the data stream 128 without waiting to receive all of the characters defining the m code words. For example, before the aforementioned characters stored in "column 2" are received by the FEC manager 112, the FEC manager 112 may begin transmitting the aforementioned characters stored in "column 1." Moreover, characters may be transmitted as they are received by the FEC manager 112. Thus, by the time the last character (i.e., "Char mk") is received, many (if not all) of the preceding characters (i.e., "Char 1" through "Char mk−1") may have been output, by the FEC manager 112, for transmission to the receiver 21.

It should be noted that the receiver 21 may be configured to rearrange the order of the data characters transmitted by the transmission system 110 to recover the code words defined by the FEC manager 112. Techniques for achieving the foregoing should be readily apparent to one of ordinary skill in the art upon reading this disclosure.

An exemplary use and operation of the transmission system 110 will now be described with particular reference to FIGS. 11–15.

Assume that the FEC manager 112 is designed to interleave four code words at a time (i.e., assume that m=4). Further assume that each code word formed by the FEC manager 112 comprises four characters within its data block 154 (FIG. 8) and two characters within its checksum block 156 (FIG. 8).

As shown by FIG. 11, the FEC manager 112 receives, from data stream 128 (FIG. 6), a string of sixteen consecutive characters of data (i.e., "Char 1" through "Char 16"). Note that a character of a lower number is received prior to each character of a higher number. Thus, "Char 1" is the first character received by the FEC manager 112, and "Char 2" is the second character received by the FEC manager 112. Further, "Char 3" is the third character received by the FEC manager 112, and so forth until "Char 16," which is the last character depicted in FIG. 11 that is received by the FEC manager 112 in the present example.

The FEC manager 112 is configured to store, in the buffer 114, the received characters according to FIG. 12. The FEC manager 112 also defines checksum information based on the received characters such that each row of the buffer 114 defines a different code word 152 (FIG. 8). Although various methodologies may be employed to achieve the foregoing, one exemplary methodology is depicted by FIG. 13.

Figure 13:
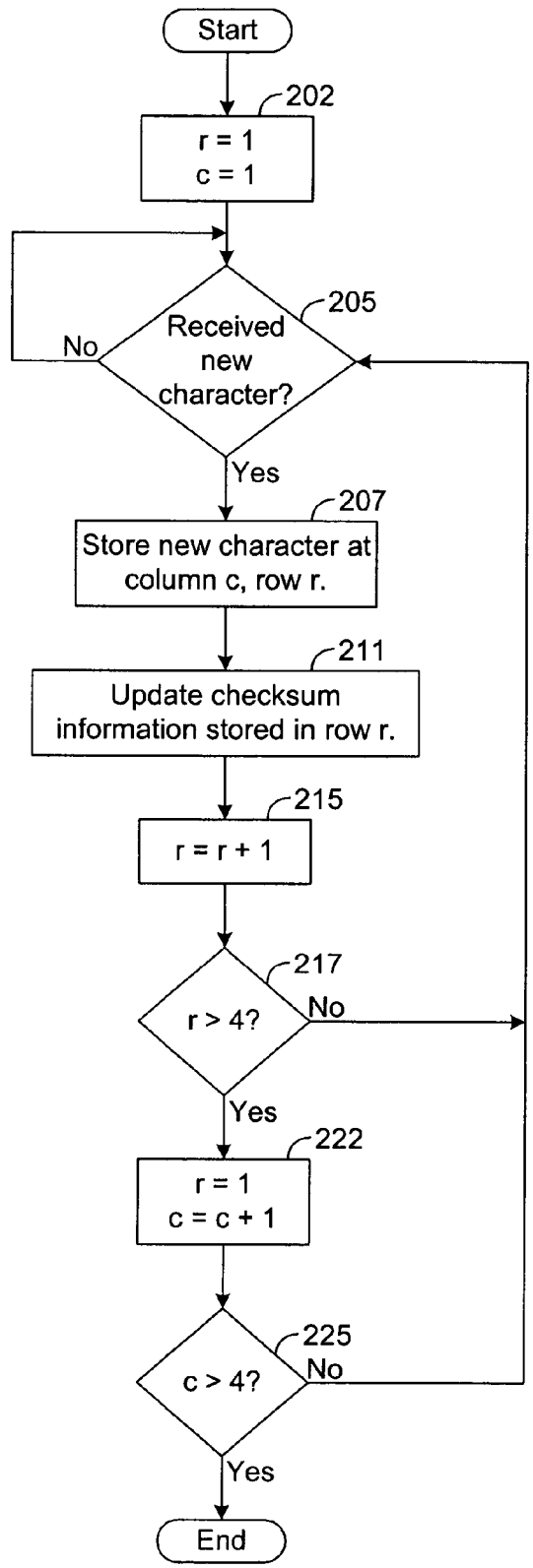
FIG. 13 is a flow chart illustrating an exemplary process for buffering data in the buffer depicted by FIG. 12.

As depicted by block 202 of FIG. 13, the FEC manager 112 initializes a variable r and a variable c to a value of one. When the FEC manager 112 receives a new data character from data stream 128, the FEC manager 112 stores the new data character at column c, row r, of the buffer 114, as shown by blocks 205 and 207. The FEC manager 112 also updates the checksum information in the same row and, therefore, in the same code word in which the new character is stored, as shown by block 211, such that this checksum information may be used to recover one or more of the data characters in the foregoing code word.

As depicted by blocks 215 and 217, the FEC manager 112 increments r and then determines whether r is greater than a value of four (i.e., the number of rows in each buffer column). If not, the column receiving the new character is not yet full, and the FEC manager 112 refrains from further adjusting the values of c and r before waiting for the next character. However, if the value of r exceeds four, then the column receiving the new character is now full, and the FEC manager 112, therefore, adjusts c and r such that the next character is stored in the first row of the next column. In this regard, the FEC manager 112 sets the value of r to one and increments c, as shown by block 222 of FIG. 13.

Once the value of c exceeds four, in the present example, all of the data characters that are to be interleaved together have been received and stored by the FEC manager 112. In other words, columns 1 through 4 are full. Thus, the FEC manager 112 determines, in block 225, whether c exceeds a value of 4. If not, the FEC manager 112 continues the process depicted by FIG. 13. However, if c exceeds four in block 225, then the process depicted by FIG. 13 ends. Note that this same process may be repeated for the next sixteen characters received by the FEC manager 112, if the FEC manager 112 continues to receive characters from the data stream 128.

As a result of the foregoing process, strings of four consecutively received characters are stored in different columns of the buffer 114, as shown by FIG. 12. In particular, a first string ("Char 1," "Char 2," "Char 3," and "Char 4") is stored in "column 1," and a second string ("Char 5," "Char 6," "Char 7," and "Char 8" stored in "column 2." Further, a third string ("Char 9," "Char 10," "Char 11," and "Char 12") is stored in "column 3," and a fourth string ("Char 13," "Char 14," "Char 15," and "Char 16") is stored in "column 4." Note that the data in the buffer 114 defines four different code words. One code word is defined by the data stored in "row 1" (i.e., "Char 1;" "Char 5;" "Char 9;" "Char 13;" "CS Char 1, 1, 2"). Similarly, each of the other code words is respectively defined by the data stored in "row 2" through "row 4."

Figure 14:
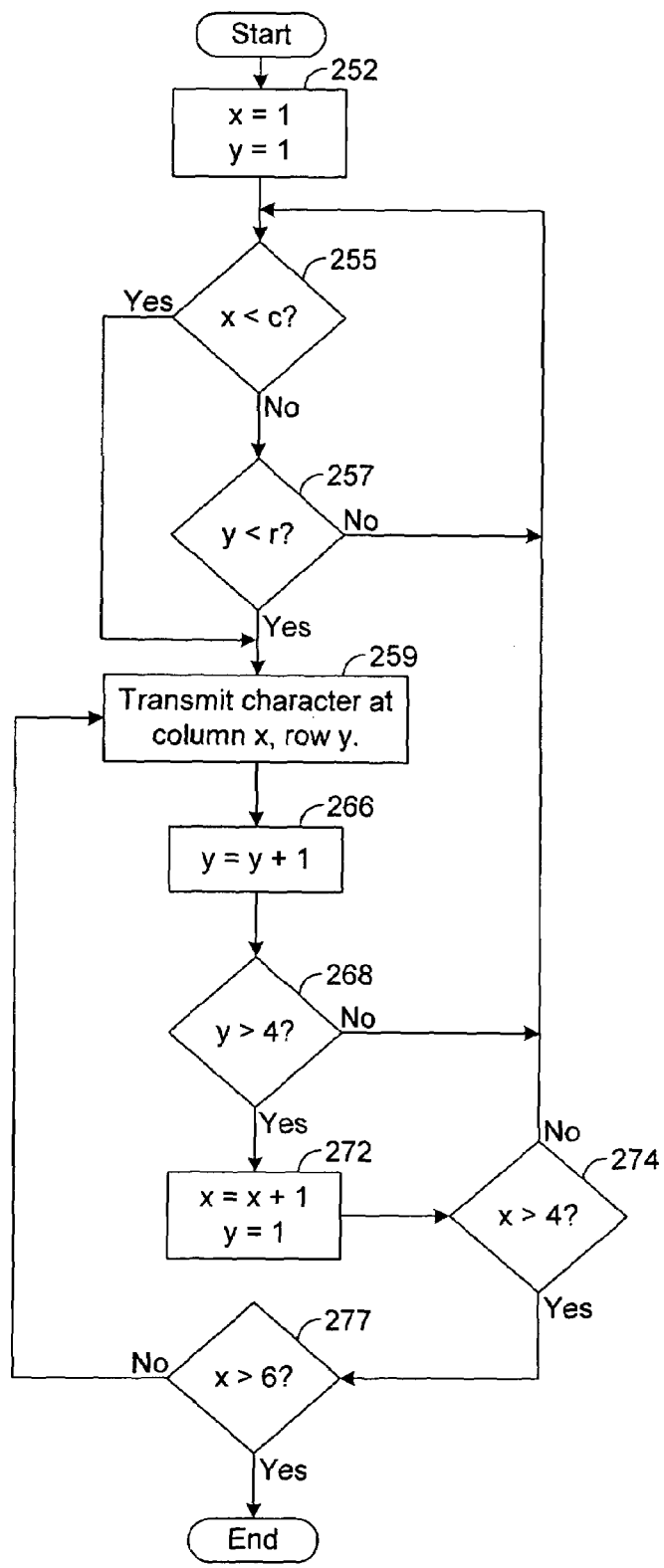
FIG. 14 is a flow chart illustrating an exemplary process for reading from the buffer depicted by FIG. 12.

As data characters are being stored in the buffer 114 according to the process depicted by FIG. 13, characters may be read out of the buffer 114 according to the process depicted by FIG. 14 and transmitted to the receiver 21. In this regard, as depicted by block 252 of FIG. 14, the FEC manager 112 initializes a variable x and a variable y to a value of one. If x is less than the aforementioned variable c or if y is less than the aforementioned variable r, then there is at least one data character that has been stored in the buffer 114 but has yet to be read out of the buffer 114. Note that such a data character is stored at column x, row y of the buffer 114. Thus, in such a situation, the FEC manager 112, as depicted by blocks 255, 257, and 259, retrieves the character at column x, row y and outputs this value to the transmitter 44, which then transmits this character to the receiver 21.

After performing block 259, the FEC manager 112 increments y and determines whether y exceeds a value of four (i.e., the number of rows storing the received data characters), as shown by blocks 266 and 268. If not, then there is still at least one other row of the same column that is to be read for transmission to the receiver 21. Thus, the FEC manager 112 repeats the aforedescribed process. However, if y exceeds four in block 268, then all of the characters stored to the foregoing column have been read from the buffer 114 for transmission to the receiver 21. Thus, in block 272, the FEC manager 112 sets the value of y to one and increments x such that the next character retrieved in block 259, if block 259 is indeed performed again, is retrieved from the first row of the next column.

After performing block 272, the FEC manager 112 determines, in block 274, whether x exceeds four (i.e., the number of columns to which data characters from data stream 128 are stored). If x does not exceed four, then all of the string of sixteen consecutive characters from the data stream 128 have yet to be read out of the buffer 114. Thus, the FEC manager 112 repeats the process depicted by FIG. 14, except that the FEC manager 112 does not perform block 252 again. However, if x exceeds four, then all sixteen consecutively received characters (i.e., "Char 1" through "Char 16") have been read out of the buffer 114 for transmission to the receiver 21. Thus, the FEC manager 112 proceeds to block 259 and begins outputting the checksum characters from the buffer 114 on a column-by-column basis. Once x exceeds the value of 6 (i.e., the total number of columns in the buffer 114), then each character depicted by FIG. 12 has been read from the buffer 114 and transmitted to the receiver 21. Thus, the process depicted by FIG. 14 ends in response to a "yes" determination in block 277.

By reading and transmitting the characters of buffer 114 according to the process depicted by FIG. 14, the characters of the buffer 114 are transmitted to the receiver 21 in the order depicted by FIG. 15, where "Char 1" is the first character transmitted and "CS Char 4, 2" is the last character transmitted. As can be seen by comparing FIG. 15 to FIG. 11, the data characters received from the data stream 128 are transmitted to the receiver 21 in the same order that such characters are received by the FEC manager 112. However, the code words defined by the FEC manager 112 are interleaved such that an occurrence of impulse noise may corrupt up to four consecutively transmitted characters without corrupting multiple characters in the same code word.

Furthermore, it should be specifically noted that the process depicted by FIG. 14 may be performed concurrently with the process depicted by FIG. 13. Indeed, it is not necessary for the FEC manager 112 to wait on subsequent data characters before transmitting a previously received data character. Thus, the transmission latency associated with the transmission system 110 is reduced.

Now, therefore, the following is claimed:

1. A forward error correction communication system, comprising:
   a forward error correction (FEC) manager configured to receive, from a data stream, a first string of successive characters and a second string of successive characters, the FEC manager further configured to define a plurality of FEC code words based on the data stream and, when defining the FEC code words, to interleave the characters of the first and second strings across the FEC code words such that each of the FEC code words comprises characters from both of the strings, each of the FEC code words having a data portion and a checksum portion, the data portion comprising characters from the first and second strings and the checksum portion comprising redundant information about each character in the data portion; and
   a transmitter configured to transmit the FEC code words to a remote receiver.

2. The system of claim 1, wherein the transmitter transmits the FEC code words such that each character of the first string is separated from each of the other characters of the first string by at least one character of the second string.

3. A forward error correction communication system, comprising:
   a forward error correction (FEC) manager configured to receive, from a data stream, a first string of successive characters and a second string of successive characters, the FEC manager further configured to define a plurality of FEC code words based on the data stream and to interleave the characters of the first and second strings such that each of the FEC code words comprises characters from both of the strings; and
   a transmitter configured to transmit the FEC code words to a remote receiver, wherein the transmitter transmits a first portion of one of the FEC code words before at least one character of a second portion of the one FEC code word is received by the FEC manager.

4. The system of claim 1, wherein the transmitter transmits the FEC code words such that the characters are transmitted by the transmitter in the same order that the characters are received by the FEC manager.

5. The system of claim 1, wherein the FEC manager is configured to define the FEC code words such that each character of the first string is assigned to a different one of the FEC code words and each character of the second string is assigned to a different one of the FEC code words.

6. The system of claim 1, wherein each of the FEC code words comprises a data portion and a checksum portion, the system further comprising a receiver configured to use the checksum portion of a corrupted FEC code word to recover a character in the data portion of the corrupted FEC code word.

7. The system of claim 1, wherein the FEC manager comprises a buffer having a plurality columns, the FEC manager configured to store each character of the first string in a first buffer column and each character of the second string in a second buffer column.

8. The system of claim 7, wherein the FEC manager is configured to output the characters of the first string from the first column and to then output the characters of the second string from the second column.

9. A forward error correction communication system, comprising:
   a forward error correction (FEC) manager configured to receive, from a data stream, a first string of successive characters and a second string of successive characters, the FEC manager further configured to define a plurality of FEC code words based on the data stream and to interleave the characters of the first and second strings such that each of the FEC code words comprises characters from both of the strings, the FEC manager comprising a buffer having a plurality of columns, the FEC manager configured to store each character of the first string in a first buffer column and each character of the second string in a second buffer column, the FEC manager further configured to output the characters of the first string from the first column and to then output the characters of the second string from the second column, wherein the FEC manager is configured to output at least one of the characters of the first string from the first column before the FEC manager stores at least one of the characters of the second string to the second column; and a transmitter configured to transmit the FEC code words to a remote receiver.

10. A forward error correction system, comprising:

a transmitter; and a forward error correction (FEC) manager configured to receive a data stream and to define a plurality of FEC code words based on the data stream, each of the FEC code words comprising a data portion and a checksum portion that may be used to recover at least one character of the data portion, the FEC manager configured to interleave characters of the FEC code words such that the FEC code words are transmitted, by the transmitter, to a remote receiver in an interleaved fashion, the FEC manager configured to provide characters from each of the FEC code words to the transmitter before a plurality of characters to be assigned to each of the FEC code words has been received by the FEC manager.

11. The system of claim 10, wherein the transmitter transmits the FEC code words such that the characters of the FEC code words are transmitted in the same order that the characters are received by the FEC manager.

12. The system of claim 10, wherein the data stream comprises a first string of successive characters and a second string of successive characters, and wherein the FEC manager defines the FEC code words such that each of the FEC code words comprises characters from both of the strings.

13. The system of claim 10, wherein the FEC manager is configured to interleave the characters across each of the FEC code words.

14. A forward error correction (FEC) transmission system, comprising:

means for receiving a data stream;

means for defining a plurality of FEC code words based on the data stream and for interleaving characters of the FEC code words; and means for transmitting at least a portion of each of the FEC code words to a receiver before any of the FEC code words has been completely defined by the defining means.

15. The system of claim 14, wherein the transmitting means transmits characters from each of the FEC code words to the receiver before a plurality of characters to be assigned to each of the FEC code words has been received by the receiving means.

16. The system of claim 14, wherein the defining means stores the characters to a buffer and interleaves the characters across the FEC code words when storing the characters to the buffer.

17. The system of claim 14, wherein the data stream comprises a first string of successive characters and a second string of successive characters, and wherein the defining means defines the FEC code words such that each of the FEC code words comprises characters from both of the strings.

18. The system of claim 17, wherein the transmitting means transmits the FEC code words such that each character of the first string is separated from each of the other characters of the first string by at least one character of the second string.

19. A forward error correction (FEC) method, comprising the steps of:

receiving a data stream, the data stream comprising a first string of successive characters and a second string of successive characters;

defining a plurality of FEC code words based on the data stream in an interleaved fashion such that each of the FEC code words comprises characters from both of the strings; and transmitting the FEC code words to a remote receiver.

20. The method of claim 19, wherein the transmitting step is performed such that each character of the first string is separated from each of the other characters of the first string by at least one character of the second string.

21. The method of claim 19, wherein the transmitting step is performed such that the characters are transmitted in the same order that the characters are received in the receiving step.

22. The method of claim 19, wherein the defining step comprises the steps of:

assigning each character of the first string to a different one of the FEC code words; and assigning each character of the second string to a different one of the FEC code words.

23. A forward error correction (FEC) method, comprising the steps of:

receiving a data stream;

defining a plurality of FEC code words based on characters received via the receiving step;

interleaving the FEC code words; and transmitting the interleaved FEC code words to a remote receiver, wherein the transmitting step comprises the step of transmitting characters from each of the FEC code words to the receiver before a plurality of characters to be assigned to each of the FEC code words has been received via the receiving step.

24. The method of claim 23, further comprising the step of buffering each of the characters of the FEC code words in a buffer, wherein the transmitting of characters from each of the FEC code words step is performed before any of said plurality of characters has been stored to the buffer.

25. The method of claim 23, wherein the transmitting the interleaved FEC code words step comprises the step of transmitting each of the characters to the receiver in the same order that the characters are received in the receiving step.

26. The method of claim 23, further comprising the step of interleaving the characters across each of the FEC code words.

27. The method of claim 23, wherein the data stream comprises a first string of successive characters and a second string of successive characters, and wherein the defining step is performed such that each of the FEC code words comprises characters from both of the strings.

28. The method of claim 19, wherein each of the FEC code words has a data portion and a checksum portion, the data portion comprising characters from the first and second strings and the checksum portion comprising redundant information about each character in the data portion.

* * * * *